(12) United States Patent
Blunno et al.

(10) Patent No.: US 9,323,538 B1
(45) Date of Patent: Apr. 26, 2016

(54) SYSTEMS AND METHODS FOR MEMORY INTERFACE CALIBRATION

(75) Inventors: Ivan Blunno, Woodbridge (CA); Gordon Raymond Chiu, North York (CA)

(73) Assignee: Altera Corporation, San Jose, CA (US)

( * ) Notice: Subject to any disclaimer, the term of this patent is extended or adjusted under 35 U.S.C. 154(b) by 855 days.

(21) Appl. No.: 13/539,153

(22) Filed: Jun. 29, 2012

(51) Int. Cl.
*G06F 3/06* (2006.01)
*G06F 3/01* (2006.01)
*G06F 3/05* (2006.01)
*G01D 18/00* (2006.01)
*G06F 9/44* (2006.01)

(52) U.S. Cl.
CPC ........................................ *G06F 9/44* (2013.01)

(58) Field of Classification Search
CPC ....................................................... G06F 17/00
USPC ......... 702/104, 107, 108, 123, 127, 154, 179; 711/137; 714/5
See application file for complete search history.

(56) References Cited

U.S. PATENT DOCUMENTS

| 7,613,883 B2 * | 11/2009 | Bellows et al. ............. 711/137 |
| 2007/0300018 A1 * | 12/2007 | Campbell et al. ............ 711/149 |
| 2010/0162037 A1 * | 6/2010 | Maule et al. ...................... 714/5 |

OTHER PUBLICATIONS

Altera "ALT_OCT, Megafunction User Guide," Altera, San Jose, CA, Dec. 2006 (42 pages).
Altera "External Memory PHY Interface (ALTMEMPHY), (nonAFI) Megafunction User Guide," Altera, San Jose, CA, Jan. 2010 (83 pages).

* cited by examiner

*Primary Examiner* — Gregory J Toatley
*Assistant Examiner* — Felix Suarez
(74) *Attorney, Agent, or Firm* — Treyz Law Group; Jason Tsai; Vineet Dixit

(57) ABSTRACT

Integrated circuits such as programmable integrated circuits may include calibration circuitry for calibrating memory interface circuitry. The calibration circuitry may include processing circuitry and test circuitry. The processing circuitry may provide instructions to the test circuitry and direct the test circuitry to begin processing at a selected instruction. The test circuitry may retrieve data storage addresses and control signal storage addresses from the instructions. The test circuitry may use the data storage address to retrieve test data from data storage circuitry and may use the control signal storage address to retrieve control signal data from control signal storage circuitry. The control signal, address, and test data may be provided to the memory interface circuitry. The test circuitry may verify data received from the system memory during instruction processing.

23 Claims, 12 Drawing Sheets

| CLOCK CYCLE | 0 | 1 | 2 | 3 | 4 | 5 | 6 |
|---|---|---|---|---|---|---|---|
| MEMORY COMMAND | NOP | WR | NOP | WR | NOP | WR | NOP |
| ADDRESS | 0 | | | ADR1 | 0 | ADR2 | 0 |
| DATA VALID | | | | | | | |
| WRITE DATA | | | | | DATA1 | DATA2 | DATA3 |

FIG. 6

|  | READ DATA | EXPECTED READ DATA | COMPARISON RESULTS | ERROR REGISTER |
|---|---|---|---|---|
| READ1 | 10000000 | 00000000 | 10000000 | 10000000 |
| READ2 | 00010001 | 00000001 | 00010000 | 10010000 |
| READ3 | 11111010 | 11111010 | 00000000 | 10010000 |
| ⋮ | | | | |

FIG. 8

SYSTEMS AND METHODS FOR MEMORY INTERFACE CALIBRATION

This application claims the benefit of and claims priority to provisional patent application No. 61/621,421, filed Apr. 6, 2012, which is hereby incorporated by reference herein in its entirety.

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock), a small amount of skew can result in faulty data transfers during read and write operations.

Programmable integrated circuits are often required to accommodate communications with different types of memory using respective memory interface protocols. For example, a programmable integrated circuit may be required to support communications with DDR, DDR2, DDR3, and synchronous dynamic random-access memory (SDRAM) that each operates using different memory interface protocols.

A portion of programmable logic on the programmable integrated circuits can be configured (programmed) to form a calibration circuit. The calibration circuit is used to calibrate timing settings of the memory interface circuitry to reduce communications errors between the programmable integrated circuit and a memory device. However, it may be difficult for the calibration circuit to effectively calibrate the memory interface circuitry as memory interface speeds increase. For example, programmable logic used to form the calibration circuit may operate at frequencies of about 75 to 100 MHz, whereas memory interface circuitry may operate at higher' frequencies of 0.8 GHz or 1 GHz (as examples).

SUMMARY

Integrated circuits such as programmable integrated circuits having memory interface circuitry are provided. The memory interface circuitry may be used to communicate with system memory (e.g., off-chip memory devices) that is mounted on a circuit board. The memory devices and the circuit board to which the memory devices are mounted may collectively be referred to as a memory module. Data and data strobe signals may be conveyed between the memory devices and the memory interface circuitry. The memory interface circuitry may provide control signals (e.g., a reference clock signal, address signal, command signal, or other control signals) to the memory devices.

The memory interface circuitry may be calibrated following device startup to ensure reliable read and write operations. The integrated circuit may include memory interface calibration circuitry. The memory interface calibration circuitry may perform calibration operations that test communications between the memory interface circuitry and the system memory. The memory interface calibration circuitry may include processing circuitry and test circuitry. The test circuitry may include data storage circuitry in which test data is stored and control signal storage circuitry in which control and address signal values are stored.

The processing circuitry may provide a sequence of instructions to the test circuitry and direct the test circuitry to begin processing at a selected instruction of the sequence. The sequence of instructions may be stored in instruction storage (e.g., an instruction memory) of the test circuitry. The test circuitry may retrieve a data storage address and a control signal storage address from the instruction. Test data may be retrieved from the data storage circuitry using the data storage address. Control signal data (e.g., memory interface control signals and address information) may be retrieved from the control signal storage circuitry using the control signal storage address. The control signal, address, and test data may be provided to the memory interface circuitry.

Test data information may be stored in a buffer (e.g., a first-in-first-out buffer) for future verification of data. The test data information may include the test data or address information that can be used to retrieve the test data from storage circuitry. The test circuitry may receive read data from the memory interface circuitry (e.g., in connection with processing of subsequent instructions of the sequence of instructions). The test circuitry may retrieve stored Lest data from the buffer (or from storage circuitry) and compare the test data with the read data to detect whether errors occurred during processing of the sequence of instructions. The comparison results may be stored in an error register by updating the error register to identify the detected errors while maintaining previously detected error information stored in the error register.

After the sequence of instructions is processed by the test circuitry, the processing circuitry may use the comparison results stored in the error register to determine whether memory interface calibration settings should be adjusted. In response to determining that errors occurred during processing, the processing circuitry may provide adjusted calibration settings to the memory interface circuitry. The processing circuitry may subsequently provide additional instruction sequences to the test circuitry for additional calibration testing.

Further features of the present invention, its nature and various advantages will be more apparent from the accompanying drawings and the following detailed description.

BRIEF DESCRIPTION OF THE DRAWINGS

FIG. 6 is an exemplary diagram of control and data signals associated with writing data to system memory in accordance with an embodiment of the present invention.

FIG. 8 is an exemplary diagram of test results that may be cumulatively stored in an error register in accordance with an embodiment of the present invention.

DETAILED DESCRIPTION

Embodiments of the present invention relate to integrated circuits that contain memory interface circuitry. The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments. As a result, these integrated circuits tend to benefit from adjustable timing capabilities of the memory interface circuitry.

Figure 1:
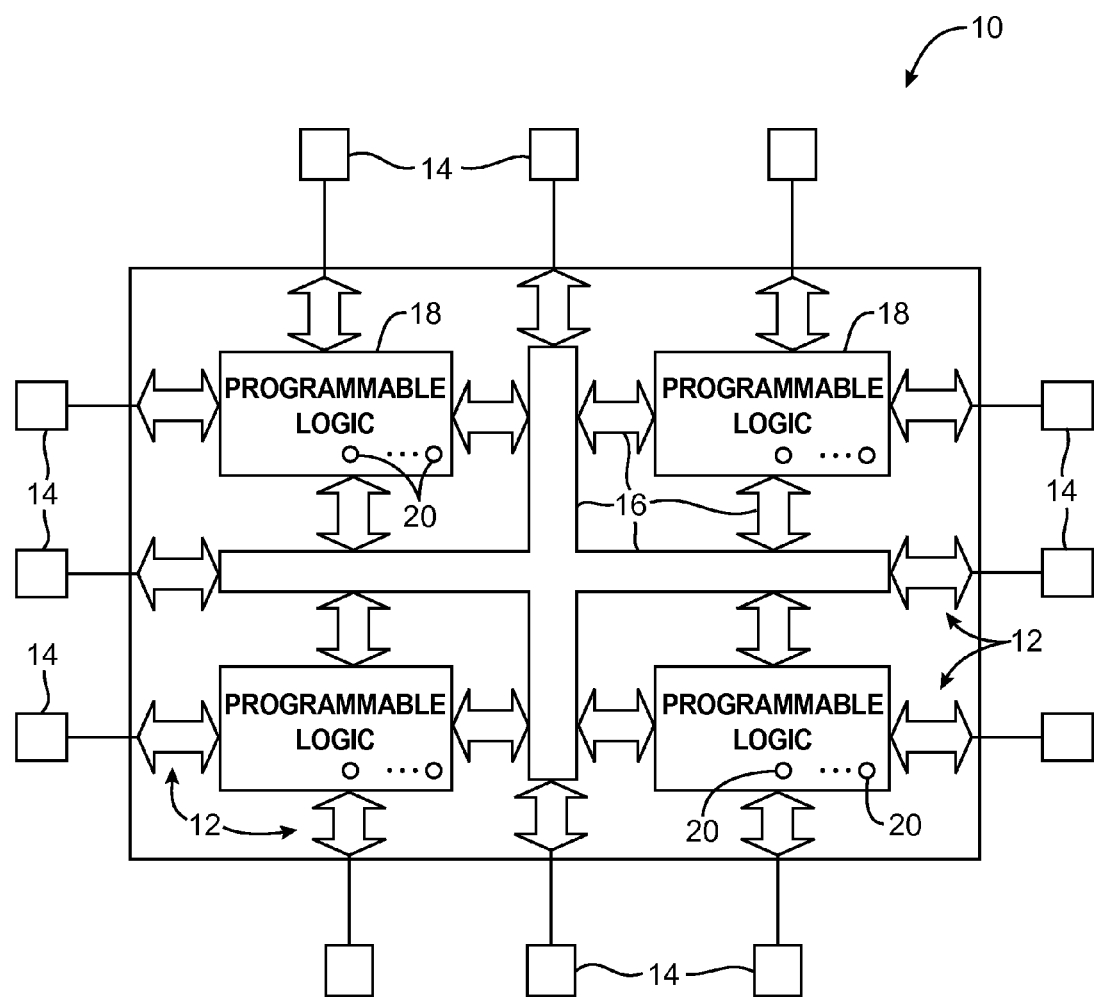
FIG. 1 is an illustrative diagram of a programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells and may therefore sometimes be referred to as programmable memory elements. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used, to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
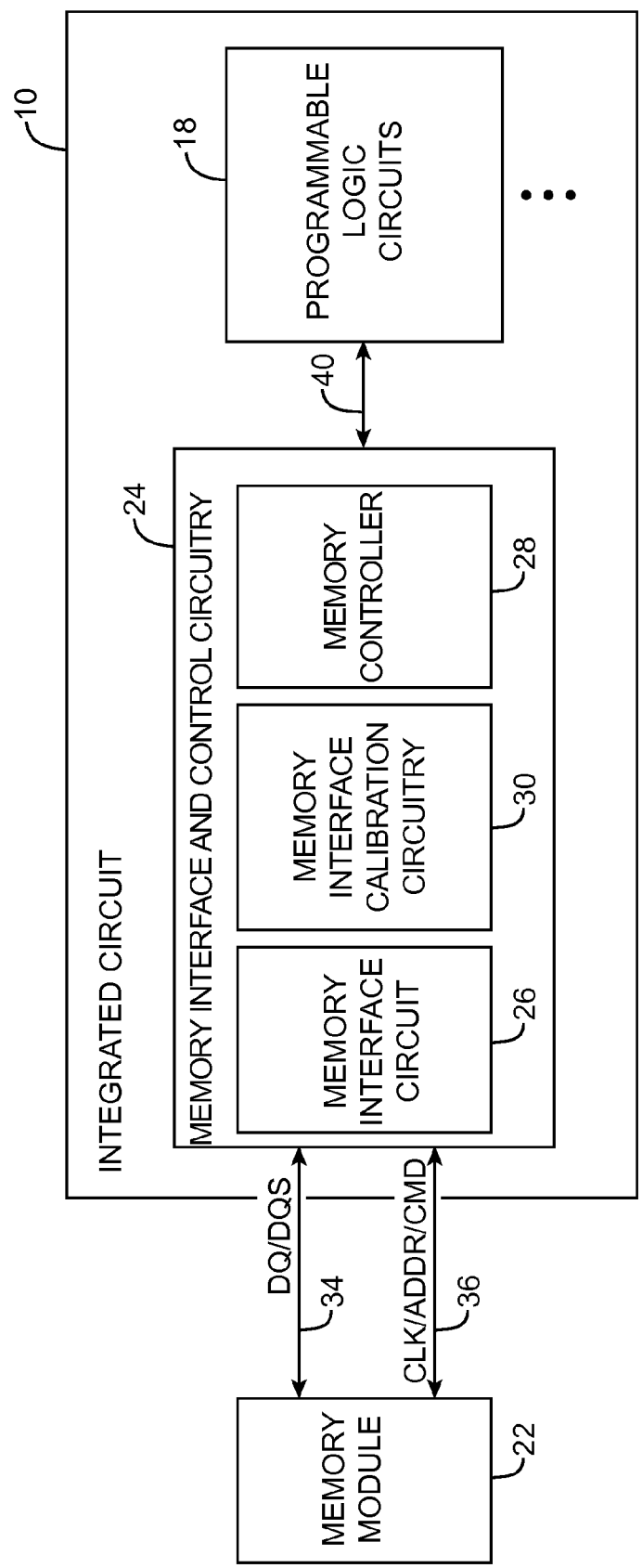
FIG. 2 is an illustrative diagram of memory interface circuitry in accordance with an embodiment of the present invention.

Device 10 may communicate with off-chip memory such as memory module 22. Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, device 10 may include memory interface circuitry 24 (sometimes referred to as memory interface and control circuitry) that serves to relay information between memory module 22 and logic circuits 18 that are internal to device 10. Memory interface circuitry 24 may include memory interface circuit 26, memory controller 28, and memory interface calibration circuitry 30.

Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS signals may be conveyed from memory interface circuit 26 to memory module 22 over path 34.

During read and write operations, control signals such as clock CLK, address ADDR, and command CMD signals may be conveyed from memory interface circuitry 24 to memory module 22 over path 36. Signal CLK may serve as a system reference clock (e.g., a reference-clock to which the DQS signals, address signal ADDR, and command signal CMD should be aligned). Signal CMD may be configured to a first value to initiate a read operation, to a second value to initiate a write operation, to a third value during normal operation, and to other values to initiate any desired operations. Command signals (CMD) may include multiple signals such as a row address strobe (RAS) signal, a column address strobe (CAS), and a write enable (WE) signal. Signal ADDR specifies the address in memory from which data is read out during a read operation and the memory address to which data is written during a write operation.

The example of FIG. 2 in which the control signals provided to memory 22 include address signal ADDR and command signals CMD is merely illustrative. If desired, other control signals such as chip select signals, on die termination (ODT) signals, or other control signals may be provided from the memory interface circuit. The control signals throughout a memory operation (e.g., a read or a write operation) may vary based on the memory protocol and/or memory device characteristics used to communicate with memory 22. For example, different memory devices that each use a given memory protocol may have different latencies when responding to control signals (e.g., read or write latencies).

Memory interface circuit 26 may serve to perform desired data rate conversions and to generate signals that meet timing requirements specified by the memory protocol currently under use. During memory interface calibration processes, memory interface circuitry 24 may be controlled using memory interface calibration circuitry 30 (e.g., to control timing characteristics of control and/or data signals, to measure read/write margins, to correct for rise/fall skew, etc.). Memory interface calibration circuitry 30 may serve to calibrate memory interface and control circuitry 24 at device startup. During normal operation, memory controller 28 and memory interface circuit 26 may directly communicate with memory 22 while memory interface calibration circuitry 30 remains idle.

Read/write data may be conveyed between memory interface circuitry 24 and programmable circuitry 18 via path 40. Memory controller 28 may be configured to generate appropriate control signals corresponding to the memory protocol currently under use (e.g., circuit 28 may handle memory data management to address desired banks, rows, and columns of system memory and to perform memory refresh). Memory controller 28 may also serve to periodically request recalibration of memory interface circuit 26.

The arrangement of FIG. 2 is merely illustrative and is not intended to limit the scope of the present invention. Integrated circuits other than programmable integrated circuits may similarly include memory interface circuitry 24 that is used to communicate with one or more memory modules 22 and may include memory interface calibration circuitry 30 for calibrating timing characteristics of memory interface circuitry 24.

Figure 3:
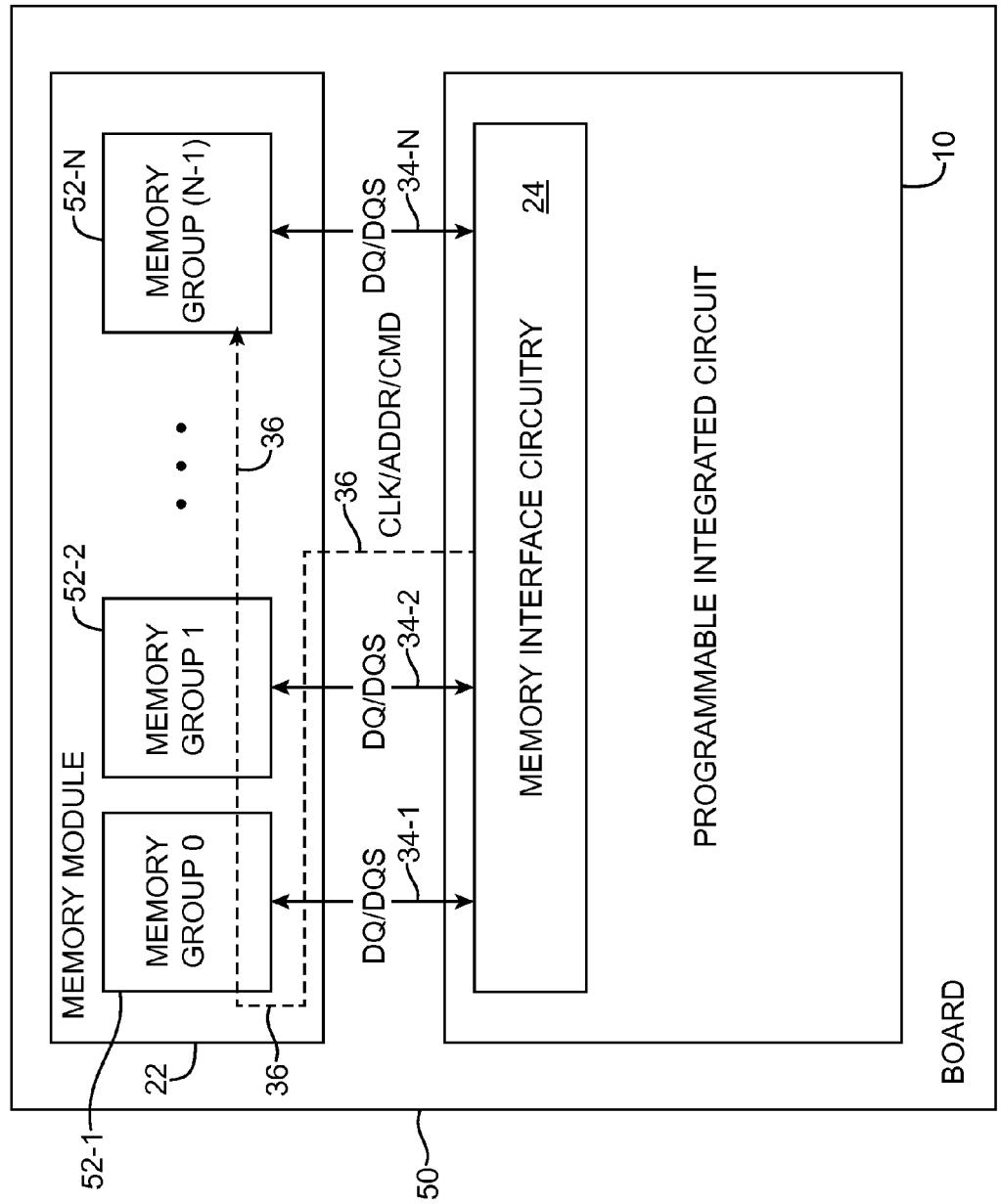
FIG. 3 is an illustrative diagram of memory interface circuitry that communicates with system memory arranged in memory groups in accordance with an embodiment of the present invention.

Memory modules 22 may include memory that is organized into groups. FIG. 3 is a diagram of illustrative memory interface circuitry that communicates with memory groups. As shown in FIG. 3, integrated circuit 10, memory module (system memory) 22, and other circuit components (e.g., integrated circuit chips, surface mount components, etc.) may be mounted on a circuit board (e.g., printed circuit board 50). Board components may be interconnected by conductive traces and packaging (e.g., sockets into which integrated circuits are mounted) formed on board 50.

Memory module 22 may include a series of memory devices, at least some of which is sometimes referred to as a memory group. For example, memory module 22 may include first memory group 52-1, second memory group 52-2, . . . , and Nth memory group 52-N. Each of the memory groups may contain hundreds or thousands of memory cells (e.g., RAM cells). The memory groups may communicate with memory interface circuitry through respective signal paths. For example, first memory group 52-1 may communicate with memory interface circuitry 24 by sending and receiving data and data strobe signals (DQ/DQS) over path 34-1, second memory group 52-2 may communicate with circuitry 24 by sending and receiving signals over path 34-2, etc.

In general, memory access operations are not synchronized with system-level control signals CLK/CMD/ADDR received at memory interface circuit 26 in device 10. As a result, the DQ signals that are received from the memory groups are not phase aligned with any known clock signal in device 10. It is therefore necessary to provide DQS clock signals with the DQ signals, so that the DQS clocks can be used to synchronize and process the DQ signals. For example, during a read operation, memory interface circuitry 24 uses the DQS clocks in capturing data as it is transmitted over paths 34 from memory 22 (see, e.g., FIG. 2). In general, the operation of each memory group is somewhat independent, so memory module 22 may generate a DQS signal for each of the memory groups.

The DQS signals for the different memory groups are generally not phase aligned with each other (e.g., skew may be present among the DQS signals). For example, although the DQS signal for a first memory group is edge-aligned with the DQ signals in the first memory group, the DQS signal for the first memory group and the second memory group (as an example) need not be in phase with each other.

Memory interface circuitry 24 may send control signals to the memory groups through path 36. The control signals on path 36 may arrive at each of the memory groups at different times. For example, because of the way path 36 is routed, the control signals on path 36 may arrive first at memory group 52-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 52-1 may output read data before subsequent memory group 52-2, memory group 52-2 may output read data before subsequent memory group 52-3, memory group 52-3 may output read data before subsequent memory group 52-4, etc. Memory interface circuitry 24 may therefore receive read data from the different memory groups at staggered times. Memory interface circuitry 24 may include calibration and delay circuitry that can be used to compensate for the skew among the different memory groups.

At device startup, memory interface circuitry 24 may not yet be calibrated properly to communicate with memory module 22 and therefore may unreliably perform reads and writes to system memory (e.g., memory 22). In general, a series of read and write calibration operations needs to be performed at device startup to ensure that critical timing constraints are met and to satisfy design criteria.

Calibration operations sometimes involve computing an optimum delay setting that centers a control or data signal within a timing window of interest. For example, it may be desirable to center DQS within each valid DQ window, to center DQS within a working range surrounding a corresponding rising edge of the system clock signal (i.e., to align DQS to a system clock signal), to center a DQS enable signal edge within a working range with respect to DQS, etc. If desired, timing characteristics of any control and data signal may be adjusted at the memory interface circuitry to help ensure reliability of read and write' operations.

Figure 4:
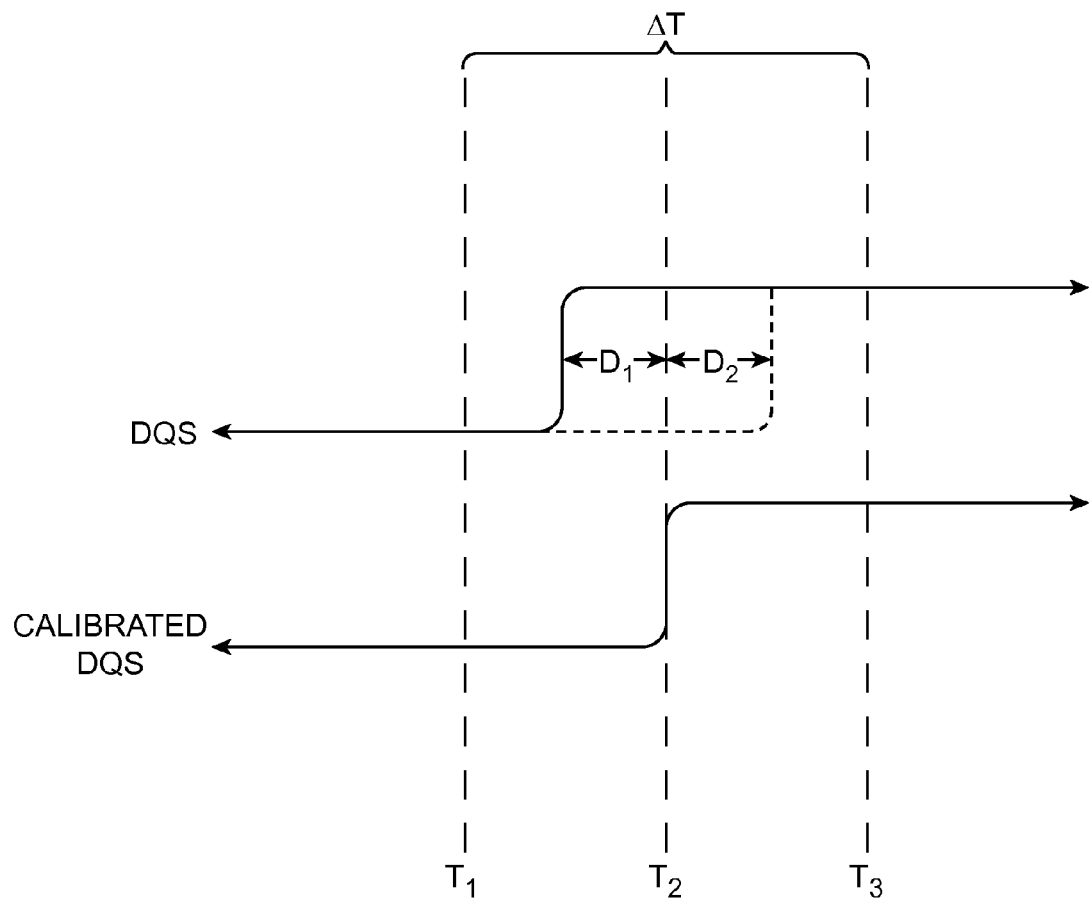
FIG. 4 is an exemplary diagram of a memory interface data signal before and after calibration in accordance with an embodiment of the present invention.

FIG. 4 is an exemplary diagram illustrating variation in a DQS signal. In the example of FIG. 4, timing window ΔT represents a desired window for DQS within which corresponding data signals (e.g., DQ signals associated with the DQS signal) are accurately transmitted and received by memory interface circuit 26. It is generally desirable for data signals to be centered within window ΔT. However, as shown by the data signal DQS, variations represented by D1 and D2 may cause signal DQS to drift from center time T2. Variations D1 and D2 may be the result of process, voltage, and temperature variations (i.e., PVT variations), parasitic signal coupling, or other sources of noise.

Calibration operations may be performed to adjust the timing of signal DQS to a desired setting (e.g., the center of a desired timing window). Calibration operations may be performed by memory interface calibration circuitry 30 to adjust variable delay elements that control the timing characteristics of data and control signals that are provided to system memory (e.g., memory module 22).

Figure 5:
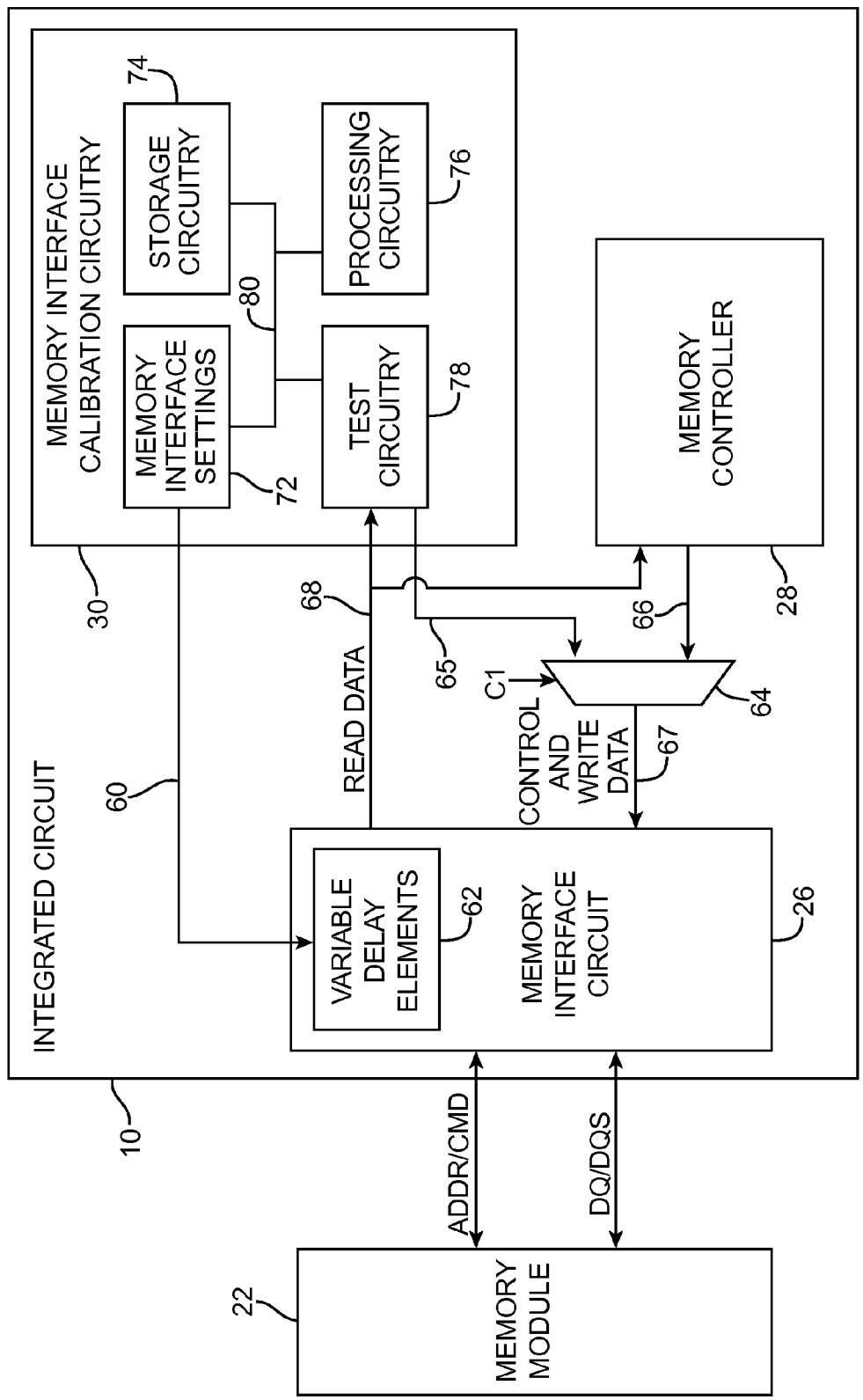
FIG. 5 is an illustrative diagram of memory interface calibration circuitry having test circuitry that may be used to perform calibration tests on a memory interface circuit in accordance with an embodiment of the present invention.

FIG. 5 is an illustrative diagram of memory interface calibration circuitry 30 that may be used to calibrate memory interface circuit 26. As shown in FIG. 5, memory interface circuit 26 may include variable delay elements 62. Variable delay elements 62 may control timing characteristics of control and data signals that are provided to memory 22 (e.g., ADDR, CMD, DQ, DQS, etc.). Variable delay elements may include any type of delay elements including analog and digital delay circuits (e.g., flip-flops, registers, inverter chains, etc.).

Memory interface' calibration circuitry 30 may include memory interface settings 72, storage circuitry 74, processing circuitry 76, and test circuitry 78 that communicate via path 80. Processing circuitry 76 may include one or more dedicated processors or may be configured from programmable logic (e.g., a programmable logic 18 may be configured via corresponding programmable memory elements 20 as a processor or to implement a finite state machine). Memory interface settings 72 may be used to store and provide appropriate memory calibration settings to variable delay elements 62 (e.g., delay settings determined from calibration operations performed by memory interface calibration circuitry 30).

If desired, memory interface settings 72 may be used to store and provide appropriate memory calibration settings for any circuitry in memory interface circuit 26 for which it is desired to perform calibration. For example, memory interface settings 72 may be used to provide appropriate settings such as buffer depth settings for first-in-first-out buffers that interface between system memory and memory interface circuit 26. As another example, clock strobe phase settings or other settings associated with timing characteristics of control signals may be calibrated.

Test circuitry 78 may be used to perform calibration operations by providing appropriate control and write data to memory interface circuit 26 (e.g., via path 65) and verifying corresponding read data from the system memory (e.g., data received via path 68). For example, processing circuitry 76 may direct circuitry 72 to provide a first set of memory interface settings to variable delay elements 62. In this scenario, processing circuitry 76 may provide a sequence of instructions to test circuitry 78 (e.g., instructions for writing test data into system memory 22 and reading the test data from system memory 22). The sequence of instructions may be performed by test circuitry 78 and data received from system memory 22 may be verified.

Multiplexer 64 may be used to select between control and write data from test circuitry 70 and memory controller 28. During test operations, multiplexer 64 may be controlled via the CTL signal to route control and write data from test circuitry 78 to memory interface circuit 26 (e.g., by coupling path 65 to path 67). During normal operation, control and write data may be routed from memory controller 28 to memory interface circuit 26 and memory module 22 (e.g., by coupling path 66 to path 67).

Test circuitry 78 may be formed as dedicated storage and processing circuitry (e.g., as an application-specific integrated circuit) that is operable to receive a sequence of instructions from processing circuitry 76 or storage circuitry 74 and process the sequence of instructions to perform calibration operations. Each instruction may correspond to a given system clock cycle and may identify which control signals and data signals should be provided to memory interface circuit 26 at that system clock cycle (e.g., for interfacing with system memory 22). FIG. 6 is an illustrative sequence of control and data signals that may be provided by test circuitry 78 to memory interface circuit 26 for writing data into system memory.

As shown in FIG. 6, control signals such as an address signal, a data valid signal, and a memory command may be provided to memory interface circuit 26 along with write data signals. The sequence of control and data signals (e.g., the control and data signals that are provided to memory interface circuit 26 in each given clock cycle) may be protocol-dependent. For example, memory interface circuit 26 may require a different sequence of control and data signals when writing data into double-data-rate two (DDR2) memory in comparison to double-data-rate (DDR) memory.

At clock cycle zero, system memory may be idle and a no-operation (NOP) command may be provided to system memory. As an example, the NOP command may be conveyed via corresponding row address strobe, column address strobe, and write enable signals. A data valid signal of logic zero may be provided to memory interface circuit 26 to indicate that the data provided to the memory interface circuit from test circuitry 78 is not valid. The write data and address provided by test circuitry 78 may be zero or any desired value, because no data is written to system memory during clock cycle zero.

At clock cycle one, a write command (WR) may be provided to system memory 22. Memory interface circuit 26 may require that the corresponding address and write data be delayed to accommodate write latencies associated with system memory 22 and the memory protocol currently being used (e.g., memory protocols such as DDR, DDR2, and DDR3 may each require different write latencies). For example, the address associated with the write command at clock cycle one may be delayed until clock cycle 3, whereas the data associated with the write command may be delayed until clock cycles four and five (e.g., memory address ADR1 and data DATA1 and DATA2 may correspond to the write command at clock cycle one). From clock cycles one through six, the memory command may be toggled between write commands (WR) and no operation commands (NOPs). The address and data information for the write commands may be correspondingly delayed to accommodate memory write latencies.

The control signals provided to memory interface circuit 26 as shown in FIG. 6 are merely illustrative. If desired, any combination of control signals may be provided to memory interface circuit 26. The control signals and the order in which control and data signals are provided to system memory may be selected based on the current protocol used to communicate with system memory 22. The control signals may include control signals such as on-die termination (ODT) signals, write data mask signals, write enable, memory burst transfer signals, chip select signals, DQS enable signals, or other control signals that are used by memory interface circuit 26 to interface with system memory 22.

The control and data signals provided to memory interface circuit 26 during any given clock cycle may vary. For example, a NOP command during clock cycle zero may be provided along with a de-asserted data valid signal, whereas a NOP command during clock cycle four may be provided with an asserted data valid signal. As another example, a write command during clock cycle one may be provided with an address of zero, a de-asserted data valid signal (logic zero), and no write data (or write data having any desired value), whereas a write command during cloak cycle 5 may be provided with address ADR2, an asserted data valid signal, and write data DATA2.

Figure 7:
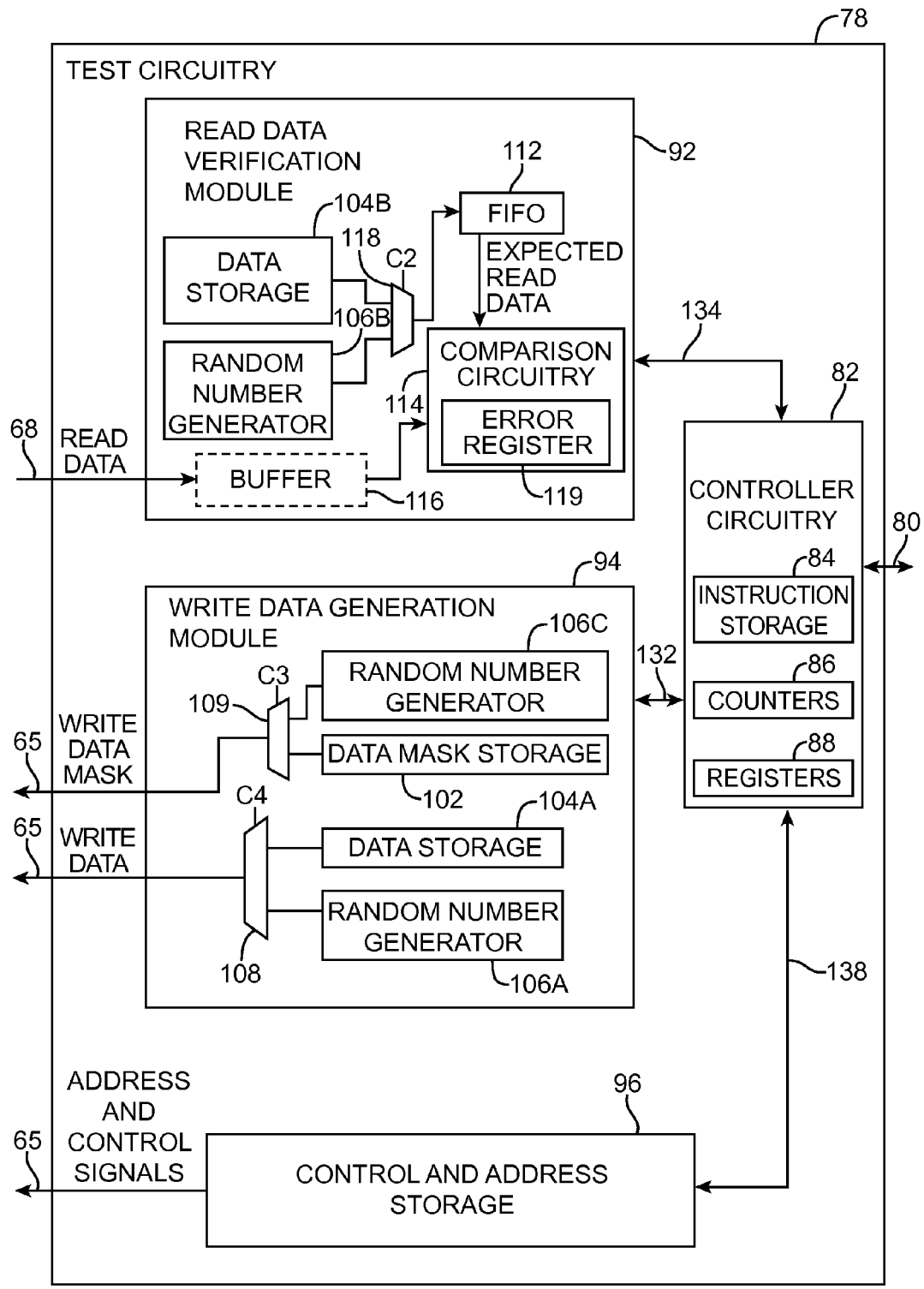
FIG. 7 is an illustrative diagram of test circuitry that may be used to perform calibration tests and verify data received from memory interface circuitry during the calibration tests in accordance with an embodiment of the present invention.

Storage of data and control signals may be decoupled within test circuitry 78 so that each instruction provided by processing circuitry 76 separately identifies a selected set of control signals and a selected set of data signals. FIG. 7 is an illustrative diagram of test circuitry 78 in which generation of data signals is decoupled from generation of control signals. As shown in FIG. 7, test circuitry 78 may include controller circuitry 82 that is coupled to path 80.

Controller circuitry 82 may receive a sequence of instructions from processing circuitry 76 via path 80. The sequence of instructions may correspond to a calibration operation. Controller circuitry may store the sequence of instructions in instruction storage 84. Instruction storage 84 may include local memory or other forms of storage for storing instructions. Controller circuitry 82 may include counters 86 and registers 88 for storing desired values.

Controller circuitry 82 may retrieve information from each instruction and may control read data verification module 92, write data generation module 94, and control and address storage 96 to process the instruction. Controller circuitry may control and communicate with modules 92, 94, and 96 via control paths 132, 134, and 138, respectively.

Write data generation module 94 and read data verification module 92 may each include data storage (e.g., data storage 104A or 104B) and a random number generator (e.g., random number generator 106A or 106B). Data storage 104A and 104B may include local memory and may be used to store a table, database, or other forms of addressable storage structures: Random number generators 106A and 106B may include circuitry suitable for generating random or pseudorandom numbers such as linear feedback shift registers (LFSRs).

Control and address storage 96 may be used to store sets of control and address signals. For example, storage 96 may include a table having entries that include values for respective sets of control and address signals. Controller circuitry 82 may direct control and address storage 96 to provide memory interface circuit 26 with control signals and an address from a selected entry of the table during processing of each instruction (e.g., each instruction stored in instruction storage 84).

During write operations (e.g., during processing of instructions associated with writing data into system memory), controller circuitry 82 may direct write data generation module 94 to retrieve desired write data from data storage 104A and route the write data through multiplexer 108 to memory interface circuit 26 (e.g., by providing an appropriate control signal C4). Controller circuitry 82 may simultaneously direct read data verification module 92 to retrieve the write data from data storage 104B and route the write data through multiplexer 118 to a buffer such as first-in-first-out (FIFO) buffer 112 (e.g., by controlling control signal C2). The write data stored in FIFO buffer 112 may be used to represent expected read values when retrieving the write data from system memory (e.g., during read operations).

In an alternate embodiment, controller circuitry may direct read data verification module 92 to store information such as a data storage address of data storage 104B in FIFO buffer 112. In this scenario, the data storage address stored in FIFO buffer 112 may be used to retrieve expected read values from storage 104B during read operations.

If desired, controller circuitry 82 may direct write generation module 94 to generate desired write data using random number generator 106A and route the generated write data through multiplexer 108 (e.g., by controlling signal C4). In this scenario, controller circuitry 82 may simultaneously direct read data verification module 92 to generate a copy of the write data using random number generator 106B. Controller circuitry 82 may synchronize random number generators 106A and 106B so that the data provided by generators 106A and 106B are the same (e.g., by providing appropriate synchronization control signals via paths 134 and 132).

In one suitable embodiment, write data generation module 94 may include data mask storage 102. Controller circuitry 82 may direct write data generation module 94 to select an appropriate write data mask from data mask storage 102 and provide the selected write data mask to memory interface circuitry 26 via path 65. The write data mask may be used by memory interface circuit 26 to selectively mask portions of corresponding write data (e.g., write data that is provided in parallel with the write data mask). If desired, the write data mask may be generated using a random number generator 106C and routed through multiplexer 109 (e.g., by controlling signal C3).

If desired, calibration tests may be performed for each memory group of system memory 22. For example, calibration tests may be performed for memory groups 52-1, 52-2, . . . , and 52-N separately. In this scenario, each memory group may be provided with a portion of the data that is to be written into system memory. As an example, each memory group may be associated with a respective eight bit portion of write data provided by test circuitry 78. By separately calibrating each memory group, data storage requirements may be reduced. For example, data entries stored in data storage 104A and 104B may include only eight bits of data (e.g., instead of N times eight bits of data).

During read operations, controller circuitry 82 may direct read data verification module 92 to compare read data received from system memory to expected read data from FIFO buffer 112. If desired, the read data received from system memory may be buffered using optional buffer 116. Comparison circuitry 114 may be used to compare the read data to the expected read data and may store comparison results in an error register 119. The comparison results may, if desired, be stored cumulatively in error register 119. FIG. 8 shows how comparison results may be cumulatively stored in error register 119 over multiple read operations.

During a first read operation READ1, comparison circuitry 114 may compare eight bits of read data (e.g., eight bits of read data corresponding to a selected memory group of memory 22) to eight bits of expected read data from FIFO buffer 112. Comparison circuitry 114 may determine that the first bit of the read data is different from the expected read data and store the comparison results in the error register as a corresponding eight bit value 10000000.

During a subsequent read operation READ2, comparison circuitry 114 may compare read data 000100001 from system memory 22 to expected read data 00000001 from FIFO buffer 114 and determine that the fourth bit of the read data is different from the fourth bit of the expected read data. In this scenario, error register 119 may be updated to reflect the error detected in the fourth bit. The value of the first bit of error register 119 may be maintained even though the first bit of the read data for read operation READ2 is the same as the expected read data, because an error was previously detected for the first bit of read data (e.g., during read operation READ1). During subsequent read operation READ3, the value of error register 119 may be maintained, because the read data for read operation READ3 matches the expected read data. The final value stored in error register 119 may be used to identify whether any errors have occurred for each bit of read data over the course of a sequence of read operations (e.g., over the course of a calibration operation), because error register 119 stores error results cumulatively.

Figure 9:
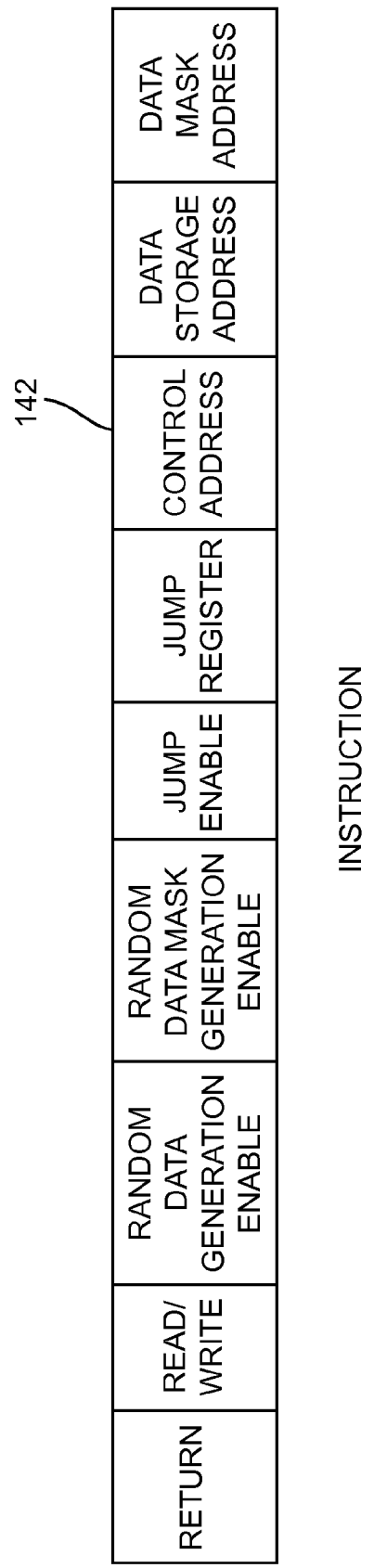
FIG. 9 is an illustrative diagram of a test instruction that may be processed by test circuitry to perform calibration tests in accordance with an embodiment of the present invention.

FIG. 9 is an illustrative diagram of an instruction 142 that may be provided by processing circuitry 76 to test circuitry 78. A sequence of instructions may be processed by test circuitry 78 to perform calibration operations.

As shown in FIG. 9, instruction 142 may include a return identifier, a read/write identifier, a random data generation enable value, a random data mask generation enable value, a jump enable value, a jump register identifier, a control address, a data storage address, and a data mask address.

The control address may be used to retrieve corresponding control and address signals from control and address storage 96. For example, the control address may be used to determine which entry in a table of control and address signals includes the desired control and address signals. The control address may be provided to control and address storage 96 via path 138 (see, e.g., FIG. 7).

The data storage address may be used to retrieve corresponding data from data storage 104A and 104B of write data generation module 94 and read data verification module 92. For example, the data table address may indicate which entry in a table of data values should be used as write data. Similarly, the data mask address may be used to retrieve corresponding data mask values from data mask storage 102.

The random data generation enable value may indicate whether write data and/or expected read data should be randomly generated. In response to determining that the random data generation enable value is asserted, appropriate control signals may be provided to random number generator 106A and multiplexer 108 via control path 132. The control signals may direct random number generator 106 to produce random (or pseudo-random) write data that is routed through multiplexer 108 to system memory. Similarly, the random data mask generation enable value may indicate whether write data masks should be randomly generated (e.g., whether write data masks are retrieved from data mask storage 102 using the data mask address or generated by random number generator 106C).

The return identifier may identify whether a sequence of instructions is complete. For example, an instruction 81 with an asserted return identifier (logic one) may identify that the instruction is the final instruction of a sequence of instructions.

The read/write identifier may determine whether expected read data should be stored or retrieved from FIFO buffer 112. For example, instructions processed during clock cycles in which write data is generated and provided to memory interface circuit 26 may include a write identifier. The write identifier may indicate that read data verification module 92 should be directed to store an expected value (e.g., an expected value produced by random number generator 106B or retrieved from data storage 104B) in FIFO buffer 112 for future comparison with read data received from system memory.

As another example, instructions processed during clock cycles in which read data is received from memory interface circuit 26 may include a read identifier. The read identifier may indicate that read data verification module 92 should be directed to retrieve an expected read data value from FIFO buffer 112 for comparison with the read data.

The jump enable value and jump register identifier may be used by test circuitry 78 to process instructions loops. The jump register identifier may be used to select a register 88 and a corresponding counter 86 for use in processing an instruction loop. Register 88 may indicate a target address within instruction storage 84, whereas the corresponding counter 86 may indicate how many times to perform the instruction loop. Upon completion of processing for the current instruction, the value of corresponding counter 86 may be decremented and the instruction at the location indicated by the target address may be subsequently processed.

Figure 10:
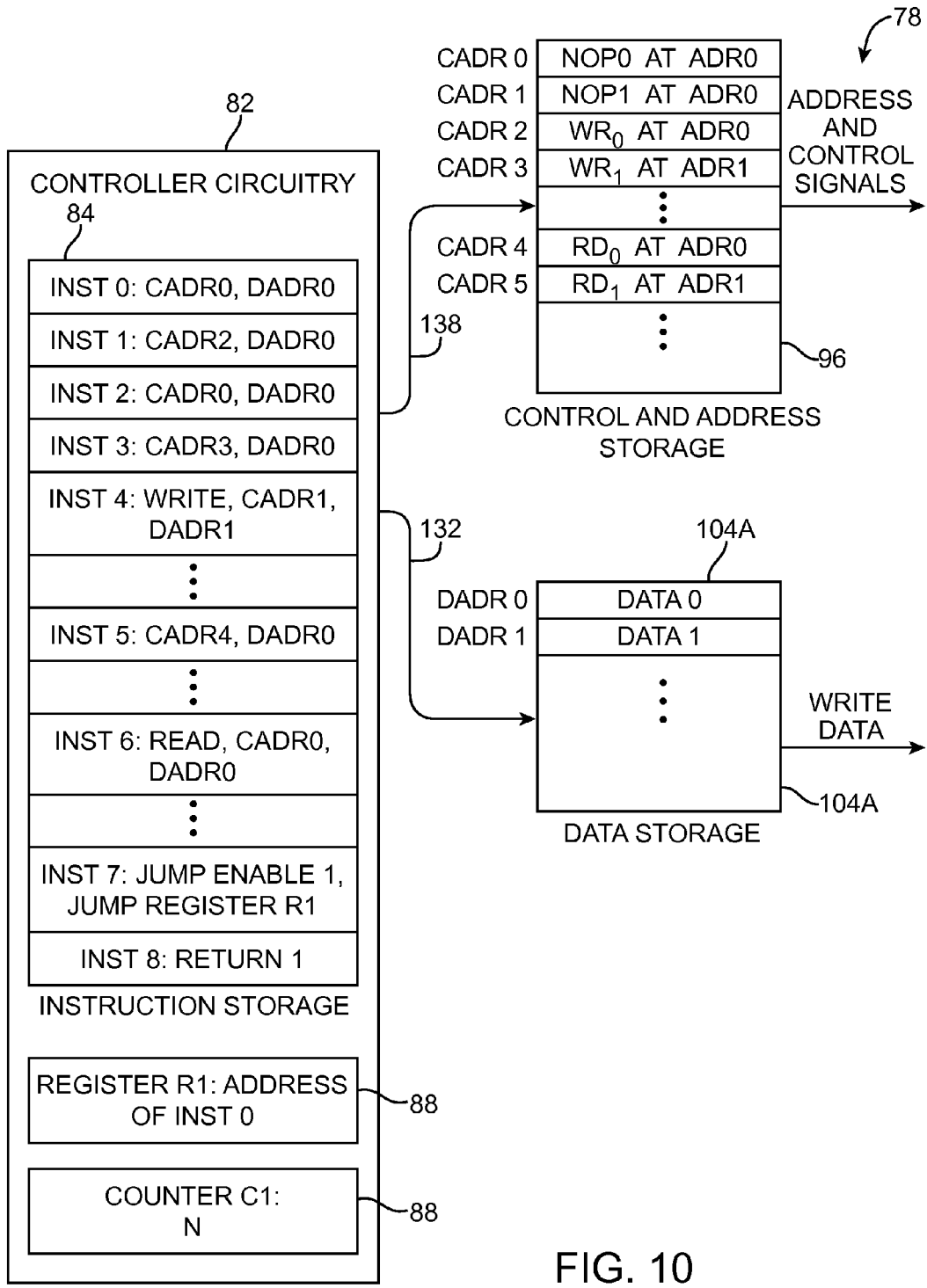
FIG. 10 is an exemplary diagram of a sequence of instructions that may be processed by test circuitry to provide control signals, address signals, and data signals to memory interface circuitry in accordance with an embodiment of the present invention.

FIG. 10 is an exemplary diagram of a sequence of instructions that may be processed by test circuitry to provide control signals, address signals, and data signals to memory interface circuitry (e.g., memory interface circuit 26). The sequence of instructions may be stored in instruction storage 84. Data storage 104A and control and address storage 96 may be used to decouple storage of data signals and control and address signals. In the example of FIG. 10, instruction storage 84 may include a sequence of instructions INST0, INST1, . . . , INST8. The instructions may, for example, be a sequence of instructions that has been provided to test circuitry 78 by processing circuitry 76.

Control and address storage 96 may include entries arranged in a table and indexed by control addresses. For example, the first entry in the table may be referenced by control address CADR0, the second entry may be referenced by control address CADR1, etc. Similarly, data storage 104A (e.g., formed as part of write data generation module 94 of FIG. 7) may include entries arranged in a table and indexed by data storage addresses DADR0 and DADR1. The entries in data storage 104A may include respective test data values for calibrating memory interface circuit 26.

The entries in control and address storage 96 may include control and address signal values that may be provided to memory interface circuit 26 during a system clock cycle. For example, the entry at address CADR0 may include control signal values NOP0 and address ADR0 corresponding to the NOP command at clock cycles zero and two of FIG. 6, whereas the entry at address CADR1 may include control signal values NOP1 and address ADR0 for the NOP command at clock cycles four and six. As another example, the entry at address CADR2 may include control signal values WR0 and address ADR0 that correspond to a write command at clock cycle one, whereas the entry at address CADR3 may include control signal values WR1 and address ADR1 that correspond to a write command at clock cycle three.

Controller circuitry 82 may process the sequence of commands stored in instruction storage 84 in sequential order. Controller circuitry 82 may, for example, process the sequence of instructions in response to a command received from processing circuitry 76 that directs controller circuitry 82 to process the sequence of instructions beginning at a selected instruction (e.g., a selected instruction identified by an instruction address used to retrieve the instruction from instruction storage 84). In the example of FIG. 10, processing circuitry 76 may direct controller circuitry 82 to begin processing at instruction INST0.

Instruction INST0 may be processed during a first system clock cycle (e.g., during clock cycle zero of FIG. 6). During processing of instruction INST0, controller circuitry 82 may retrieve information from INST0 that identifies a corresponding control address CADR0 and a data storage address DADR0. Controller circuitry 82 may direct control and address storage 96 to provide the address and control signals stored in the entry corresponding to control address CADR0 to memory interface circuit 26 (e.g., control signal values NOP0 and address ADR0).

In subsequent clock cycles, instructions INST1, INST2, INST3, and INST4 may be processed sequentially by controller circuitry 82 to write data stored at data storage address DADR1 (e.g., DATA1) into system memory (e.g., by providing appropriate control signal and data signal values to memory interface circuit 26). During processing of instruction INST4, controller circuitry 82 may identify that data is being provided to memory interface circuit 26 (e.g., instruction INST4 may include a write identifier).

In response to identifying that data is being provided to memory interface circuit 26, controller circuitry 82 may direct read data verification module 92 (e.g., module 92 of FIG. 7) to store an expected read value from data storage 104B to FIFO buffer 112. As an example, data storage 104B may include a copy of the entries of storage 104A. In this scenario, controller circuitry 82 may use the data storage address identified by INST4 to determine which entry of data storage 104B to store in FIFO buffer 112 (e.g., data storage address DADR1 may be used to select an entry from data storage 104A of write data generation module 94 and storage 104B of read data verification module 92).

After processing of instruction INST4, additional instructions (not shown) may be processed to write additional data into system memory using control signal values and addresses stored in entries of storage 96 and using test data values stored in storage 104A.

After completion of the write operations (e.g., instructions INST0, . . . , INST4), instructions INST5 and INST6 may be performed. Instructions INST5 and INST6 may correspond to a read operation in which data written into system memory is retrieved and verified. Instruction INST5 may correspond to a read initialization step in which control signals for initializing a read operation are provided to system memory 22 via memory interface circuit 26.

The initialization control signals for instruction INST5 (signals RD0) may be stored at control address CADR4. Additional read operation instructions may be included between instructions INST5 and INST6 (e.g., because a read operation may require multiple clock cycles in which initialization control signals and address signals are provided to memory interface circuit 26).

Instruction INST6 may correspond to a clock cycle in which read data is received from memory interface circuit 26 and provided to read data verification module 92. Controller circuitry 82 may direct read data verification module 92 to retrieve an expected read data value from FIFO buffer 92 (e.g., the expected read data value stored in FIFO buffer 92 during processing of instruction INST4) for comparison with the read data, because instruction INST6 includes a read identifier.

Instruction INST7 may be used to loop through instructions INST0, . . . , INST6. Instruction INST7 may indicate that a processing jump should be performed (e.g., the jump enable value may be logic one) and that register R1 identifies which instruction to jump to. Register R1 may have been programmed with the address of instruction INST0 (e.g., using processing circuitry 76). Using the information stored in register R1, controller circuitry 82 may process instruction INST0 after instruction INST7.

Registers such as register R1 may be associated with respective counters that can be loaded (e.g., using processing circuitry 76) with values that indicate how many loops should be performed in connection with a loop instruction such as instruction INST7. For example, counter C1 that is associated with register R1 may be loaded with a counter value N that indicates how many times instruction INST7 should loop back to instruction INST0. Each time instruction INST7 is processed, the value stored in counter C1 may be decremented. When the counter value of counter C1 reaches zero, controller circuitry 84 may process the instruction at the next instruction address (e.g., instruction INST8) instead of looping back to the instruction identified by the associated register.

Processing of a sequence of instructions may be terminated at an instruction with a return value of logic one. For example, the sequence of instructions from instruction INST0 to instruction INST8 may be terminated upon reaching instruction INST8.

Figure 11:
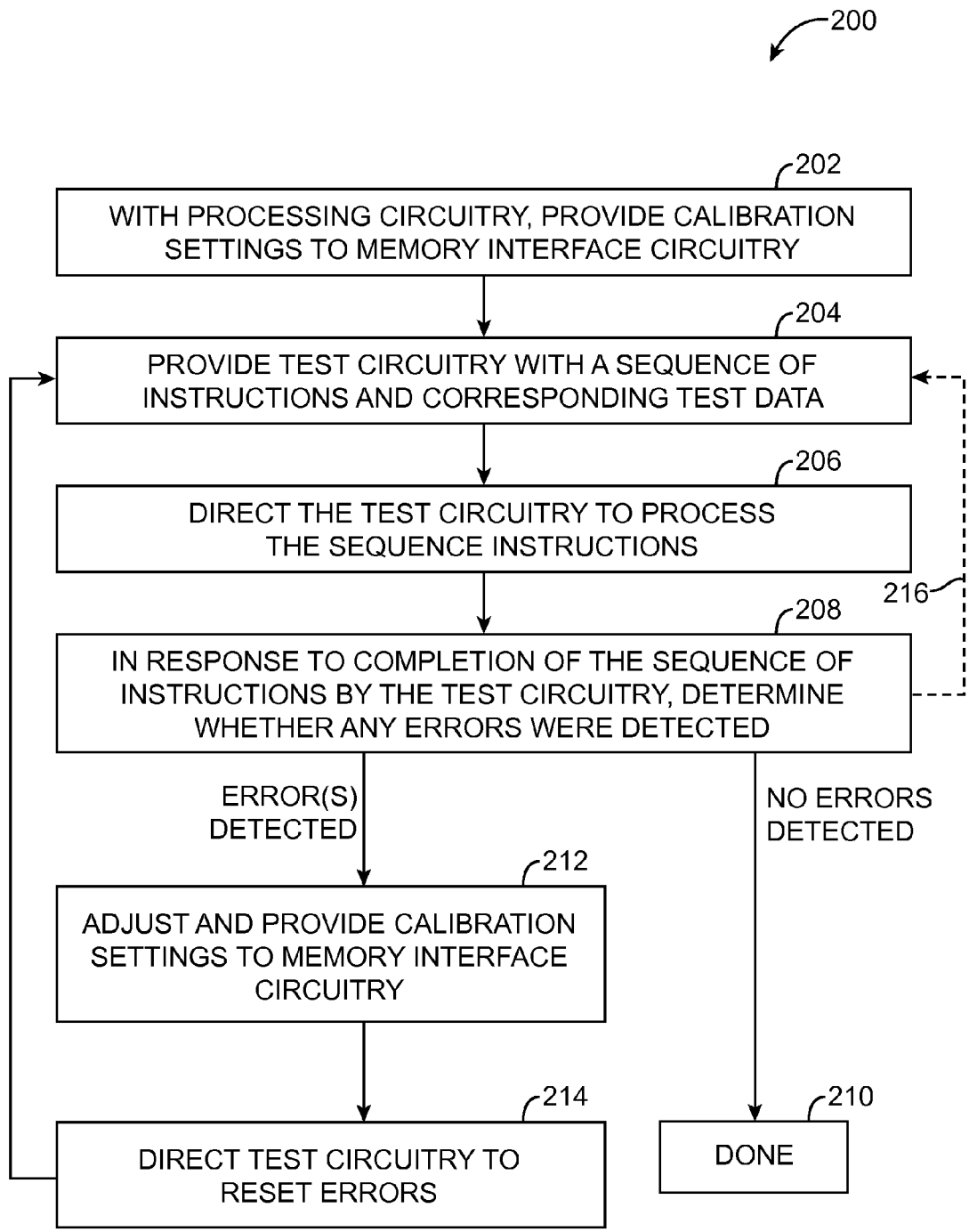
FIG. 11 is a flow chart of illustrative steps that may be performed by processing circuitry to calibrate memory interface circuitry using test circuitry in accordance with an embodiment of the present invention.

FIG. 11 is a flowchart 200 of illustrative steps that may be performed by processing circuitry such as processing circuitry 76 to calibrate memory interface circuitry such as memory interface circuit 26 using dedicated test circuitry (e.g., test circuitry 78).

In step 202, the processing circuitry may provide calibration settings to the memory interface circuitry. The calibration settings may be determined from default values for adjustable delay circuits that control timing characteristics of control and data signals between system memory and the memory interface circuitry (e.g., between memory module 22 and memory interface circuit 26). As an example, the calibration settings may be provided to variable delay elements 62 that control the timing of signals such as ADDR/CMD and DQ/DQS signals between memory module 22 and memory interface circuit 26 of FIG. 5.

In step 204, the processing circuitry may provide a sequence of instructions and corresponding test data to test circuitry (e.g., test circuitry 78). For example, a sequence of instructions 142 may be provided to test circuitry 78. The sequence of instructions may be stored in circuitry such as instruction storage 84 at the test circuitry. The sequence of instructions may include write instructions for writing the test data into system memory and corresponding read instructions for reading the test data from system memory. The test data may be loaded into data storage such as data storage 104A and 104B.

In step 206, the processing circuitry may direct the test circuitry to process the sequence of instructions (e.g., after the sequence of instructions has been stored at the test circuitry). As an example, the processing circuitry may instruct the test circuitry to begin processing at a selected instruction within the sequence of instructions (e.g., by providing an instruction address that corresponds to the location in instruction storage 84 at which the selected instruction is located). In response to receiving a command to begin processing, the test circuitry may process the sequence of instructions to store the test data in system memory and verify read data received from system memory using the test data.

In step 208, the processing circuitry may determine whether any errors occurred during processing of the sequence in response to completion of the sequence of instructions by the test circuitry. Detected errors may be identified by retrieving the value stored in an error register such as error register 119. The bits of the error register value may indicate which data lines between the system memory and the memory interface circuitry are associated with read and/or write errors.

If desired, the processing circuitry may retrieve read data from a buffer such as buffer 116 in which read data received from system memory during processing of the sequence of instructions is stored. The read data from the buffer may be used in addition to or instead of the value stored in error register 119 when determining calibration settings (e.g., during step 212). For example, the read data may be used to determine which read and write operations fail testing.

If no errors have been detected, the process may be complete (e.g., step 210). If desired, additional test sequences may be processed by looping back to step 204 via optional path 216. In response to determining that one or more errors occurred during processing of the sequence of instructions, the processing circuitry may determine that the calibration settings need to be adjusted and the operations of step 212 may be performed.

In step 212, the processing circuitry may determine updated calibration settings. If desired, the updated calibration settings may be determined based on previous error results (e.g., based on the results of testing performed for different calibration settings). The calibration settings may be adjusted so that signal paths associated with asserted error bits of error register 119 are calibrated. For example, each bit of the value stored in error register 119 may correspond to a different DQ/DQS path between system memory and the memory interface circuitry. In this scenario, the processing circuitry may adjust delay settings for error bits that have been asserted (logic one) while maintaining the delay settings for error bits that have not been asserted (logic zero).

In step 214, the processing circuitry may direct the test circuitry to reset the detected errors (e.g., by resetting the error bits of error register 119) in preparation for additional calibration testing. The process may then loop back to step 204 to calibrate delay settings by testing additional instruction sequences.

Figure 12:
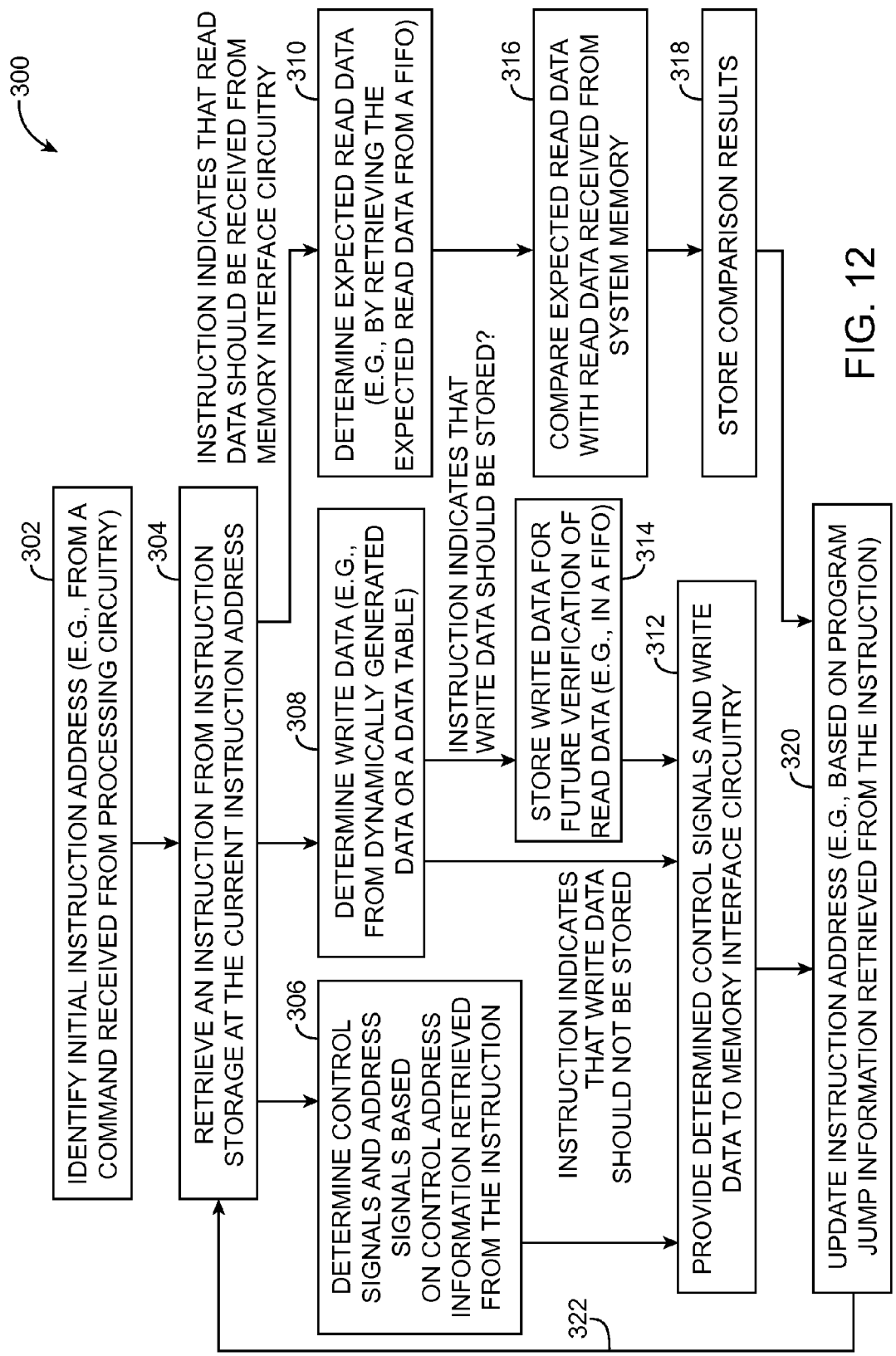
FIG. 12 is a flow chart of illustrative steps that may be performed by test circuitry to process a sequence of instructions in accordance with an embodiment of the present invention.

FIG. 12 is a flowchart 300 of illustrative steps that may be performed by test circuitry such as test circuitry 78. The steps of flowchart 300 may, for example, be performed by test circuitry 78 in response to receiving a sequence of instructions and test data from processing circuitry (e.g., processing circuitry 76). The sequence of instructions may be stored in instruction storage 84 (e.g., an instruction memory).

In step 302, the test circuitry may identify an initial instruction address (e.g., an instruction at which to begin processing). The initial instruction address may be determined from a command received from processing circuitry (e.g., a command that identifies an instruction or an instruction address of instruction storage).

In step 304, the test circuitry may retrieve an instruction from instruction storage at the current instruction address. Control signals corresponding to the retrieved instruction may be determined during step 306. Write data corresponding to the retrieved instruction may be determined during step 308. If retrieved instruction indicates that read data should be received from memory interface circuitry (e.g., memory interface, circuit 26), the operations of step 310 may be performed.

Steps 306, 308, and 310 may be performed in parallel. For example, controller circuitry 82 may control read data verification module 92, write data generation module 94, and control and address storage 96 in parallel to determine control signals, address signals, data signals, and verify read data in parallel. If desired, operations associated with steps 306, 308, and 310 may be performed sequentially.

In step 306, the test circuitry may determine control signals and address signals based on control address information retrieved from the instruction. For example, control circuitry 82 may retrieve a control address from the instruction and provide the control address to control and address storage 96. In this scenario, control and address storage 96 may receive the control address and retrieve control and address signal values from a corresponding entry in a table. The retrieved control and address signal values may be provided from the test circuitry to system memory via memory interface circuit 26.

In step 308, the test circuitry may determine write data signals. The determined write data signals may be provided to memory interface circuit 26. Memory interface circuit 26 may pass the write data signals to system memory during write operations (e.g., when the control signals from step 306 indicate that data is to be written to system memory).

The test circuitry may determine whether valid write data (e.g., test data) is to be provided to memory interface circuit 26 during processing of the current instruction. If valid write data is to be provided to memory interface circuit 26 (e.g., if the instruction indicates that write data should be stored), the operations of step 314 may be performed to store the write data for future verification of read data. For example, the test circuitry may perform the operations of step 314 in response to determining that the current instruction includes a write identifier. The write data may be stored in a buffer such as FIFO buffer 112 in read data verification module 92. If desired, write data information such as a data storage address may be stored in FIFO buffer 112. In this scenario, the write data information may be used to retrieve the write data (e.g., during verification of read data). If the instruction indicates that write data should not be stored, the operations of step 312 may be performed.

In step 312, the determined signals (e.g., the control signals and write data) may be provided to memory interface circuit 26. Memory interface circuit 26 may receive the determined signals and provide corresponding signals to system memory (e.g., corresponding signals such as ADDR/CMD and DQ/DQS signals having timing characteristics controlled by variable delay elements 62 of FIG. 5).

In step 310, expected read data may be determined for comparison with read data received from system memory (e.g., via memory interface circuit 26). The expected read data may, for example, be retrieved from a buffer such as FIFO 112. Alternatively, the expected read data may be retrieved from storage 104B based on address information from FIFO 112.

In step 316, the expected read data may be compared with the read data received from system memory to determine whether any errors occurred during either writing of the data into system memory (e.g., during previous write operations) or reading of the data from system memory. In step 318, the comparison results may be stored (e.g., in error register 119). The comparison results may be cumulatively stored.

In step 320, the current instruction address may be updated. The instruction address may be updated based on program jump (instruction jump) information retrieved from the current instruction. For example, the instruction may include a jump identifier of logic one and may identify a corresponding jump register (e.g., one of registers 88). In this scenario, the instruction address may be determined from an address stored in the identified register and an associated counter (e.g., one of counters 86). If the instruction does not identify that a jump should be performed, the current instruction address may be updated to the next sequential instruction address.

The calibration techniques described herein may be performed following device startup or during operation of device 10, if desired. For example, operation of device 10 may be periodically halted to allow for recalibration throughout the lifetime of the memory system.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for calibrating memory interface circuitry on an integrated circuit using calibration circuitry on the integrated circuit, wherein the calibration circuitry includes data storage circuitry and control signal storage circuitry, the method comprising:
   processing an instruction stored in the calibration circuitry by retrieving a data storage address and a control signal storage address from the instruction;
   retrieving test data from the data storage circuitry using the data storage address; and
   retrieving control signal data from the control signal storage circuitry using the control signal storage address.

2. The method defined in claim 1 further comprising:
   with the calibration circuitry, retrieving the instruction from instruction storage circuitry in the calibration circuitry.

3. The method defined in claim 2 further comprising:
   providing the memory interface circuitry with the test data and the control signal data.

4. The method defined in claim 1 further comprising:
   storing test data information in a buffer for future verification of data received from the memory interface circuitry.

5. The method defined in claim 4 further comprising:
   receiving data from the memory interface circuitry;
   retrieving the test data information from the buffer;
   retrieving the test data from a table using the test data information; and
   comparing the test data from the table and the data received from the memory interface circuitry to produce comparison results.

6. The method defined in claim 4 wherein storing the test data information in the buffer comprises storing the test data in the buffer, the method further comprising:
   receiving data from the memory interface circuitry;
   retrieving the test data from the buffer; and
   comparing the test data from the buffer and the data received from the memory interface circuitry to produce comparison results.

7. The method defined in claim 6 further comprising:
   storing the comparison results in a register, wherein the comparison results are stored while maintaining previously produced comparison results that have been stored in the register.

8. The method defined in claim 6 wherein the buffer comprises a first-in-first-out buffer and wherein retrieving the test data from the buffer comprises retrieving the test data from the first-in-first-out buffer.

9. The method defined in claim 1 wherein the calibration circuitry further comprises data mask storage circuitry, the method further comprising:
   retrieving a data mask storage address from the instruction;
   retrieving data mask values from the data mask storage circuitry using the data mask storage address; and
   providing the data mask values to the memory interface circuitry.

10. The method defined in claim 1 wherein the calibration circuitry further comprises random data generation circuitry operable to produce random data values, the method further comprising:
    retrieving information from the instruction that identifies whether the test data should be randomly generated or retrieved from the data storage circuitry, wherein retrieving the test data from the data storage circuitry using the data storage address comprises:
    in response to determining that the retrieved information identifies that the test data should be retrieved from the data storage circuitry, retrieving the test data from the data storage circuitry using the data storage address.

11. The method defined in claim 10 further comprising:
    in response to determining that the retrieved information identifies that the test data should be randomly generated, generating the test data using the random data generation circuitry.

12. The method defined in claim 11 wherein the random data generation circuitry comprises a linear feedback shift register operable to produce pseudo-random data and wherein generating the test data using the random data generation circuitry comprises:
    with the linear feedback shift register, generating pseudo-random data.

13. An integrated circuit that communicates with memory, comprising:
    memory interface circuitry coupled to the memory;
    data generation circuitry that produces test data;
    control signal storage circuitry that stores control signal values and memory address values; and
    control circuitry that directs the data generation circuitry to provide the test data to the memory interface circuitry and also directs the control signal storage circuitry to provide the control signal values and memory address values to the memory interface circuitry.

14. The integrated circuit defined in claim 13 wherein the data generation circuitry comprises a storage circuit in which a table of test data entries is stored and wherein the control circuitry also directs the data generation circuitry to produce the test data from a selected test data entry of the table of test data entries.

15. The integrated circuit defined in claim 13 wherein the data generation circuitry comprises a linear feedback shift register that produces the test data.

16. The integrated circuit defined in claim 13 further comprising:
    verification circuitry that receives data from the memory interface circuitry and that identifies test errors based on the received data.

17. The integrated circuit defined in claim 16 wherein the verification circuitry comprises a storage circuit in which a table of expected data entries is stored and wherein the verification circuitry also identifies the test errors by comparing the received data to a selected expected data entry of the table of expected data entries.

18. A method for calibrating memory interface circuitry on an integrated circuit, the method comprising:
   using the processing circuitry to provide the memory interface circuitry with calibration settings;
   using the processing circuitry to provide a sequence of instructions to test circuitry; and
   using the test circuitry to process an instruction of the sequence of instructions to retrieve a control signal address from the instruction.

19. The method defined in claim 18 further comprising:
   using the test circuitry to retrieve control signal values from control signal storage circuitry using the control signal address;
   using the test circuitry to provide the control signal values to the memory interface circuitry; and
   using the test circuitry to provide the memory interface circuitry with test data.

20. The method defined in claim 19 further comprising:
   using the test circuitry to receive data from the memory interface circuitry;
   using the test circuitry to identify test error information based on the received data; and
   using the test circuitry to store the test error information in a register.

21. The method defined in claim 20 further comprising:
   using the processing circuitry to retrieve the test error information from the register; and
   using the processing circuitry to adjust the calibration settings based on the test error information.

22. The method defined in claim 18 further comprising:
   using the test circuitry to identify a subsequent instruction of the sequence of instructions based on information retrieved from the instruction.

23. The method defined in claim 18 wherein the memory interface circuitry is operable to communicate with a memory using a memory interface protocol, the method further comprising:
   using the processing circuitry to store control signal values in control signal storage circuitry based on the memory interface protocol.

* * * * *